(12) United States Patent
Ying et al.

(10) Patent No.: US 10,873,145 B2
(45) Date of Patent: Dec. 22, 2020

(54) GROUND HEAT SINK FOR DUAL INLINE MEMORY MODULE COOLING

(71) Applicant: Intel Corporation, Santa Clara, CA (US)

(72) Inventors: Guoliang Ying, Shanghai (CN); Na Chen, Shanghai (CN); Liguang Du, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/465,087

(22) PCT Filed: Dec. 29, 2016

(86) PCT No.: PCT/CN2016/112935
§ 371 (c)(1),
(2) Date: May 29, 2019

(87) PCT Pub. No.: WO2018/119839
PCT Pub. Date: Jul. 5, 2018

(65) Prior Publication Data
US 2019/0319385 A1 Oct. 17, 2019

(51) Int. Cl.
*H05K 7/00* (2006.01)
*H01R 12/73* (2011.01)
(Continued)

(52) U.S. Cl.
CPC ........... *H01R 12/737* (2013.01); *H01R 31/06* (2013.01); *H05K 1/0203* (2013.01); *H05K 1/09* (2013.01);
(Continued)

(58) Field of Classification Search
USPC ........................................................ 361/760
See application file for complete search history.

(56) References Cited

U.S. PATENT DOCUMENTS

| | | |
|---|---|---|
| 6,031,727 A | 2/2000 | Duesman et al. |
| 6,608,763 B1 | 8/2003 | Burns et al. |

(Continued)

FOREIGN PATENT DOCUMENTS

| | | |
|---|---|---|
| WO | 2015172841 A1 | 11/2015 |
| WO | 2018119839 A1 | 7/2018 |

OTHER PUBLICATIONS

PCT International Search Report and Written Opinion for PCT/CN2016/112935 dated Sep. 30, 2017; 14 pages.

*Primary Examiner* — Andargie M Aychillhum
(74) *Attorney, Agent, or Firm* — Patent Capital Group

(57) ABSTRACT

Aspects of the embodiments are directed to a printed circuit board (PCB) that includes a conductive layer extending from the printed circuit board to act as a heat sink for circuit components electrically and mechanically attached to the PCB. The conductive layer can be a copper ground layer of a multi-layered PCB. The PCB can include one or more circuit components, such as dynamic random access memory elements. In embodiments, the PCB is part of a dual inline memory module. The conductive layer can be fashioned such that it extends out from the PCB and returns over the circuit elements to define an air gap between the conductive layer and the surface of the PCB and/or the surface of the circuit elements. In embodiments, a connection adaptor can be used to accommodate various PCB thicknesses so that the PCB can be electrically connected to an edge connector.

20 Claims, 10 Drawing Sheets

(51) Int. Cl.
*H01R 31/06* (2006.01)
*H05K 1/02* (2006.01)
*H05K 1/09* (2006.01)
*H05K 1/11* (2006.01)
*H05K 1/18* (2006.01)

(52) U.S. Cl.
CPC ............ *H05K 1/115* (2013.01); *H05K 1/181* (2013.01); *H05K 2201/10159* (2013.01); *H05K 2201/10325* (2013.01)

(56) References Cited

U.S. PATENT DOCUMENTS

| | | | | |
|---|---|---|---|---|
| 2002/0023341 | A1* | 2/2002 | Lorenz | H01L 25/072 |
| | | | | 29/830 |
| 2006/0067066 | A1* | 3/2006 | Meier | H05K 1/14 |
| | | | | 361/785 |
| 2008/0116571 | A1 | 5/2008 | Dang et al. | |
| 2009/0291571 | A1* | 11/2009 | Davis | G06F 21/71 |
| | | | | 439/55 |
| 2010/0182105 | A1* | 7/2010 | Hein | H01P 3/003 |
| | | | | 333/239 |
| 2015/0261265 | A1* | 9/2015 | Dean | G01R 1/0408 |
| | | | | 361/679.31 |
| 2015/0301568 | A1 | 10/2015 | Hill et al. | |
| 2016/0148918 | A1* | 5/2016 | Ye | H01L 24/04 |
| | | | | 711/154 |

* cited by examiner

GROUND HEAT SINK FOR DUAL INLINE MEMORY MODULE COOLING

CROSS-REFERENCE TO RELATED APPLICATION

This application is a national stage application under 35 U.S.C. § 371 of PCT International Application Serial No. PCT/CN2016/112935, filed on Dec. 29, 2016 and entitled "GROUND HEAT SINK FOR DUAL INLINE MEMORY MODULE COOLING," which is hereby incorporated by reference herein in its entirety.

TECHNICAL FIELD

This disclosure pertains to ground heat sink for dual inline memory module cooling.

BACKGROUND

Server central processor technological development trends towards increasing numbers of dual inline memory modules (DIMMs) on the same board to match CPU performance. Design and manufacturing of memory and circuit component boards, however, are trending towards maintaining overall form factors, and in some cases, reducing form factors for denser system design. As a result, the DIMM pitch will be smaller, making it difficult to cool DIMMs onboard.

DETAILED DESCRIPTION

Figure 1:
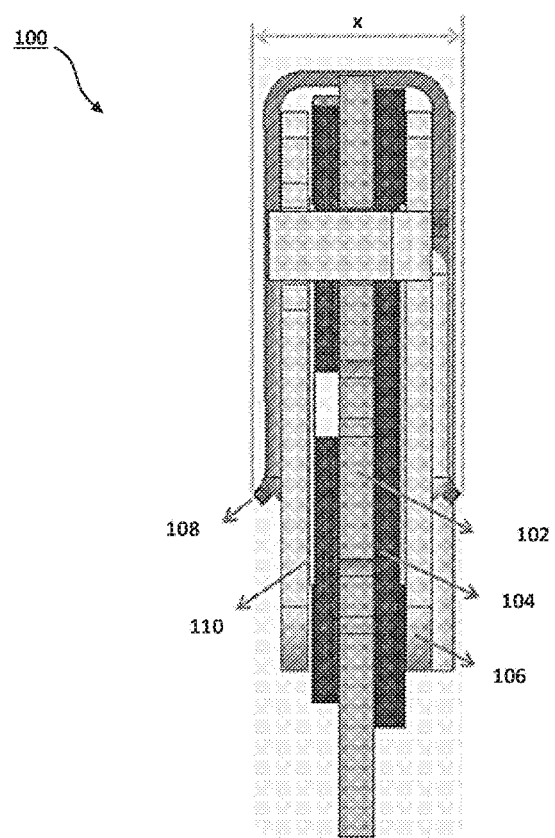
FIG. 1 is an example dual inline memory module (DIMM) that includes a full DIMM heat spreader.

FIG. 1 is an example dual inline memory module (DIMM) 100 that includes a full DIMM heat spreader (FDHS) 106. The DIMM 100 includes a raw card 102 that can be a printed circuit board or other type of board that can hold a DRAM 104 and other integrated circuit elements.

For high power DIMMs, such as DIMM 100, typically a full DIMM heat spreader (FDHS) 106 can be designed to cool the DIMM 100 with a clip retention 108 on it. This makes the total DIMM thickness "x" more than 8 mm and the possibility becomes even less to use such thick DIMM 100 in small DIMM pitch form factor systems.

This disclosure describes an extended ground copper layer of PCB board to help cool the DIMM. Also described herein is a DIMM adaptor to allow for the DIMM compatibly with standard DIMM connector on the board. Aspects of the embodiments provide for increasing the number of DIMMs on a package. Additionally, no thermal interference material is required, which helps to reduce cost and overall form factor of the DIMM package.

Figure 2:
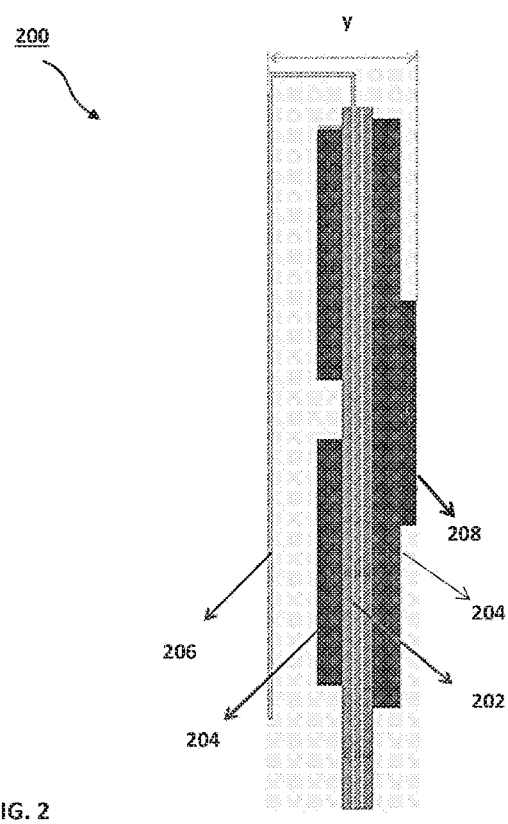
FIG. 2 is a schematic diagram of an example dual inline memory module with a heat sink in accordance with embodiments of the present disclosure.

FIG. 2 is a schematic diagram of an example dual inline memory module (DIMM) 200 with a heat sink 206 in accordance with embodiments of the present disclosure. The DIMM 200 includes a raw card 202. Raw card 202 can be a multi-layered printed circuit board. The raw card 202 can include ground layers, traces, vias, surface bonding pads, and other layers that facilitate electrical communications between circuit elements (such as circuit element 204) and an edge connector. In some embodiments, a buffer 208 can reside on one or more of the circuit elements 204. In embodiments of this disclosure, a copper ground layer of the PCB can also act as a heat sink 206. The heat sink 206 can be formed by folding the ground layer twice so that the heat sink 206 defines an air gap between itself and a surface of the DIMM 200. The heat transfer path is mainly through this copper layer heat spreader directly.

Figure 3:
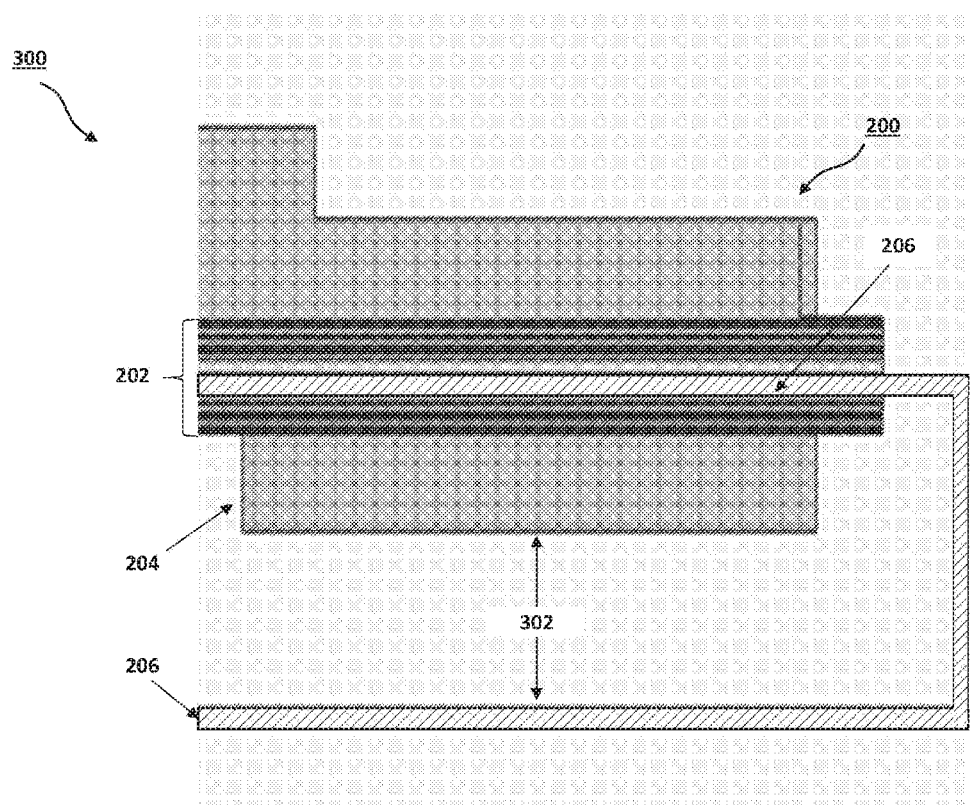
FIG. 3 is a schematic diagram of a cross sectional view of an example dual inline memory module in accordance with embodiments of the present disclosure.

FIG. 3 is a schematic diagram of a cross sectional view 300 of the example dual inline memory module 200 of FIG. 2 in accordance with embodiments of the present disclosure. FIG. 3 illustrates a portion of the DIMM 200 shown in FIG. 2. The multiple layers of the printed circuit board 202 are shown. The copper ground layer forming the heat sink 206 is illustrated by a cross-hatched portion. The heat sink 206 is shown extending from the PCB 202 and bent twice to define an air gap 302 between the heat sink 206 and a circuit component 204 on the PCB 202.

Figure 4:
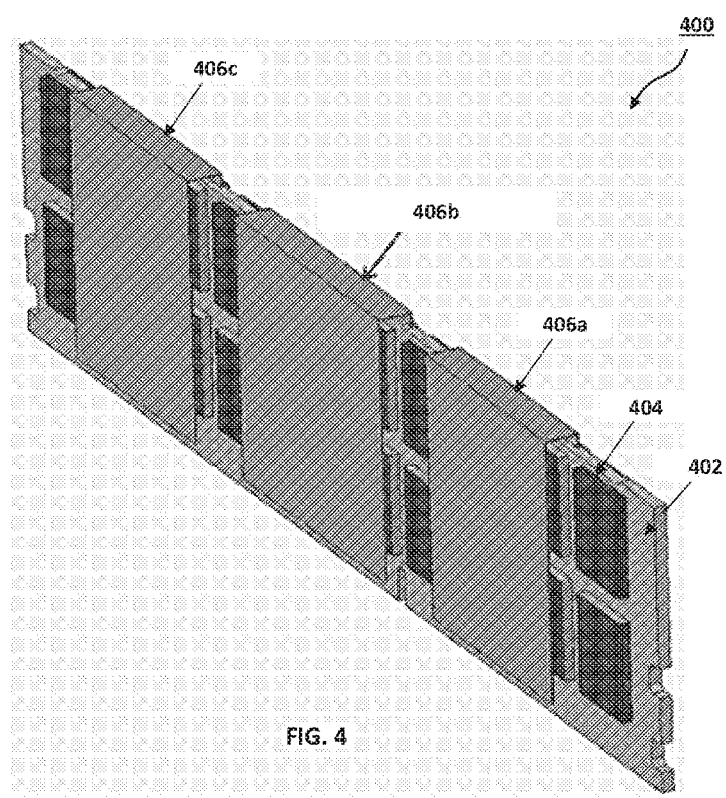
FIG. 4 is a schematic diagram of a isometric view of a dual inline memory module that includes three heat sinks in accordance with embodiments of the present disclosure.

FIG. 4 is a schematic diagram of a isometric view of a dual inline memory module 400 that includes three heat sinks 406a-406c in accordance with embodiments of the present disclosure. The DIMM 400 includes a PCB 402 that can accommodate a plurality of circuit elements, such as DRAM 404. A first copper ground layer 406a can extend from the PCB 402 at a first location of the PCB 402. A second copper ground layer 406b can extend from the PCB 402 at a second location of the PCB 402. A third copper ground layer 406a can extend from the PCB 402 at a third location of the PCB 402.

Figure 5A:
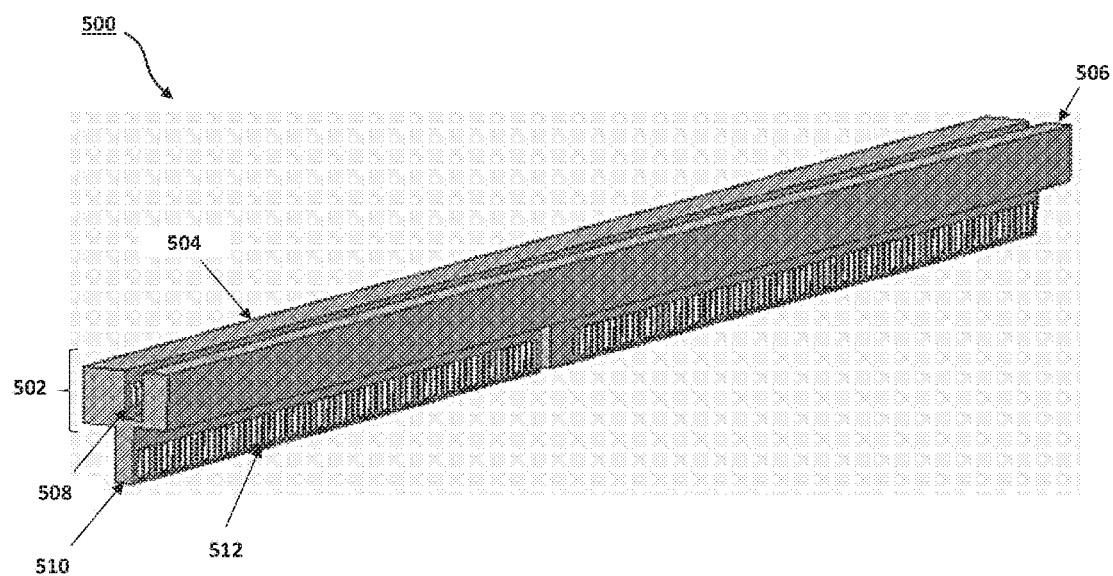
FIG. 5A is a schematic diagram of an connection adaptor in accordance with embodiments of the present disclosure.
Figure 5B:
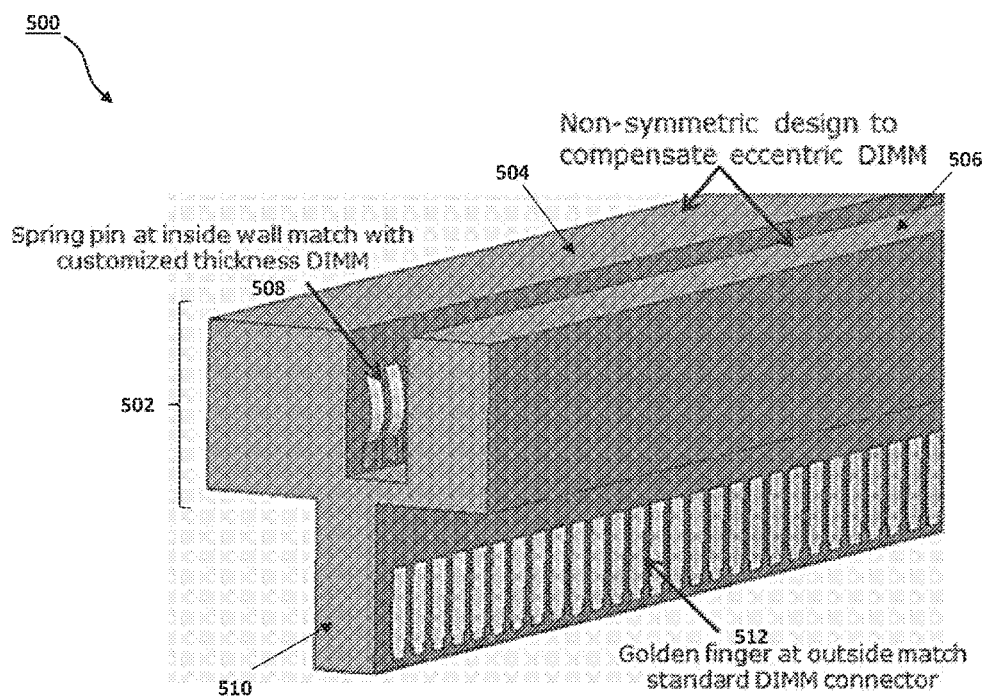
FIG. 5B is a schematic diagram of a close-up view of the connection adaptor of FIG. 5A in accordance with embodiments of the present disclosure.

FIG. 5A is a schematic diagram of an connection adaptor 500 in accordance with embodiments of the present disclosure. FIG. 5B is a schematic diagram of a close-up view of the connection adaptor of FIG. 5A in accordance with embodiments of the present disclosure. DIMM connector adaptor 500 facilitates the use a DIMM board with a different thickness and larger air gap for cooling without changing current layout design and system cooling solution.

In order to adapt the DIMM design of the present disclosure into smaller DIMM pitches while also being compatible with standard DIMM slot on the board, a connection adaptor 500 can be used. The connection adaptor 500 can include a DIMM receiving portion 502. The DIMM receiving portion 502 can include a wide portion 504 and a narrower portion 506. The receiving portion 502 can receive a DIMM that includes the ground heat sink as described above, so that the ground heat sink is on the side of the wide portion 504. The additional width can add stability to the DIMM when it is connected by the connection adaptor to the underlying board. Between the wide portion 504 and the narrower portion 506 can be a receiver for the DIMM board. The receiver can include electrical contacts 508 that can electrically connect pins on the PCB to the edge connector.

The connection adaptor can also include an interconnect portion 510. The interconnect portion 510 includes a plurality of electrical contacts 512 that can electrically connect the electrical contacts 508 to the edge connector (shown in FIG. 6).

Figure 6:
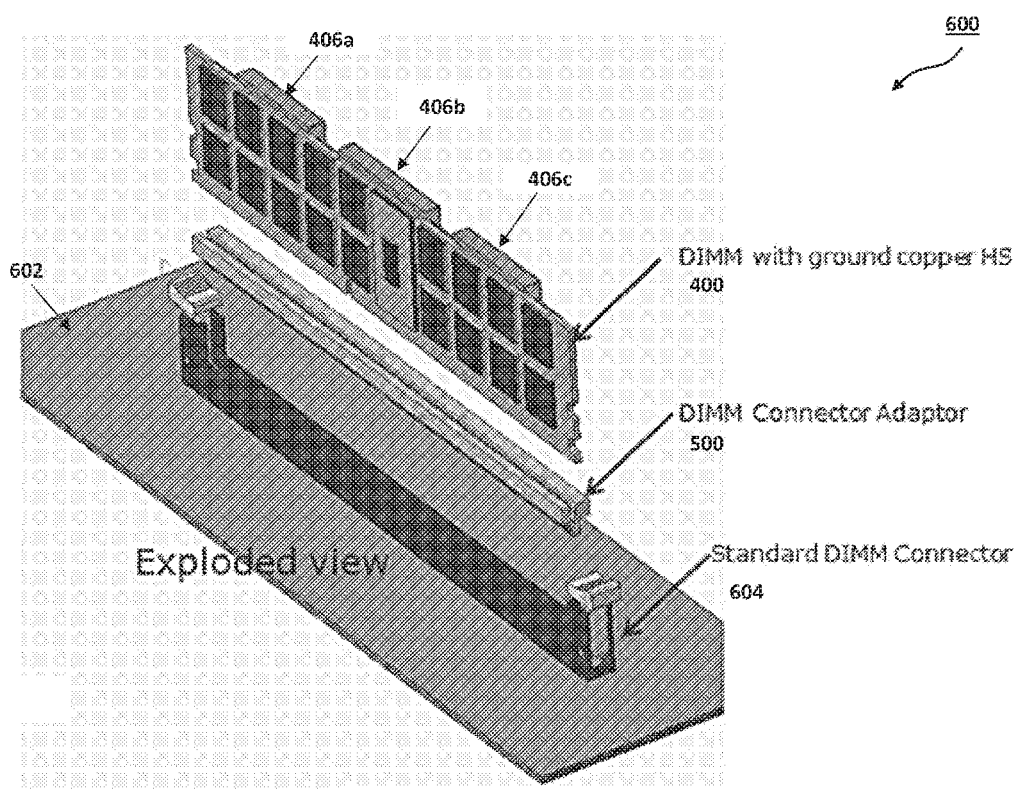
FIG. 6 is a schematic diagram of an exploded view of a dual inline memory module (DIMM) with a heat sink, a DIMM connection adaptor, and a standard DIMM connector in accordance with embodiments of the present disclosure.

FIG. 6 is a schematic diagram of an exploded view 600 of a dual inline memory module (DIMM) with a heat sink, a DIMM connection adaptor, and a standard DIMM connector in accordance with embodiments of the present disclosure. FIG. 6 shows a board 602 with an edge connector 604 (shown as a standard DIMM connector 604). The edge connector 604 can receive the connection adaptor 500, which can receive the DIMM 400. DIMM 400 includes the ground heat sinks 406a-406c.

Figure 7:
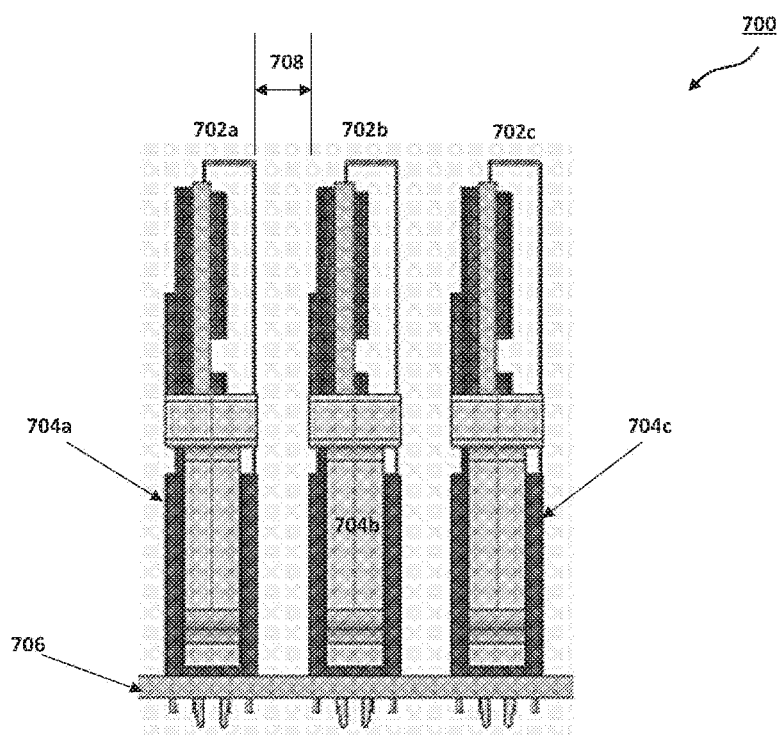
FIG. 7 is a schematic diagram of a set of dual inline memory modules on a board and separated by an air gap in accordance with embodiments of the present disclosure.

FIG. 7 is a schematic diagram 700 of a set of dual inline memory modules 702a-702b on a board 706 and separated by an air gap 708 in accordance with embodiments of the present disclosure. Board 706 can receive a set of DIMMs 702a-702c. The DIMM card thickness "y" (indicated in FIG. 2) can be flexible and still be compatible with a standard DIMM slot on the board. In many cases, DIMM performance is determined by the cooling solution capability on the board (which can be sensitive to, e.g., the size of air gap 708 between DIMMs 702a-702b).

The air gap 708 between DIMMs 702a-702b is mainly determined by the DIMM pitch and card thickness. DIMM pitch is trending smaller and smaller from generation to generation for dense system design purpose. This will negatively impact the cooling capability of the DIMMs and limit DIMM performance as the air gap between DIMMs become smaller also with the typical 1 mm thick aluminum heat spreader and clip retention to cool the DIMM.

One example here is to compare 5 scenarios: DIMM without a heatsink, DIMM with 1 mm FDHS, DIMM with 0.5 mm FDHS, DIMM with 0.15 mm Ground Heatsink (GND HS) and DIMM with 0.3 mm GND Heatsink. The table below shows thermal and DIMM thickness result comparison between these 5 scenarios. Given ambient as 40 C, DIMM power as 14.6 w (DRAM 0.35 w*36 and Buffer 2.0 w). The thermal resistance of hottest DRAM and Buffer at each velocity can be compared. The table also shows the comparison of support power for each scenario.

| Scenarios @ 1.7 m/s | 0.15 mm GND HS | 0.3 mm GND HS | 1.0 mm FDHS | 0.5 mm FDHS | No FDHS |
|---|---|---|---|---|---|
| Support Pwr Lmt by DRAM (w) | 16.2 | 17.1 | 15.9 | 14.5 | 12.1 |
| Support Pwr Lmt by buffer | 14.2 | 15.0 | 19.0 | 16.9 | 8.2 |
| Each DRAM Pwr | 0.39 | 0.42 | 0.39 | 0.35 | 0.28 |
| BW improvement | 41% | 50% | 38% | 24% | 0% |
| Nominal DIMM thickness (mm) | 5.56 | 5.71 | 8.04 | 7.04 | 3.47 |

GND HS can support higher DIMM power and bandwidth. Besides GND HS cooling reduces DIMM flow resistance and impedance with much thinner HS.

Figure 8:
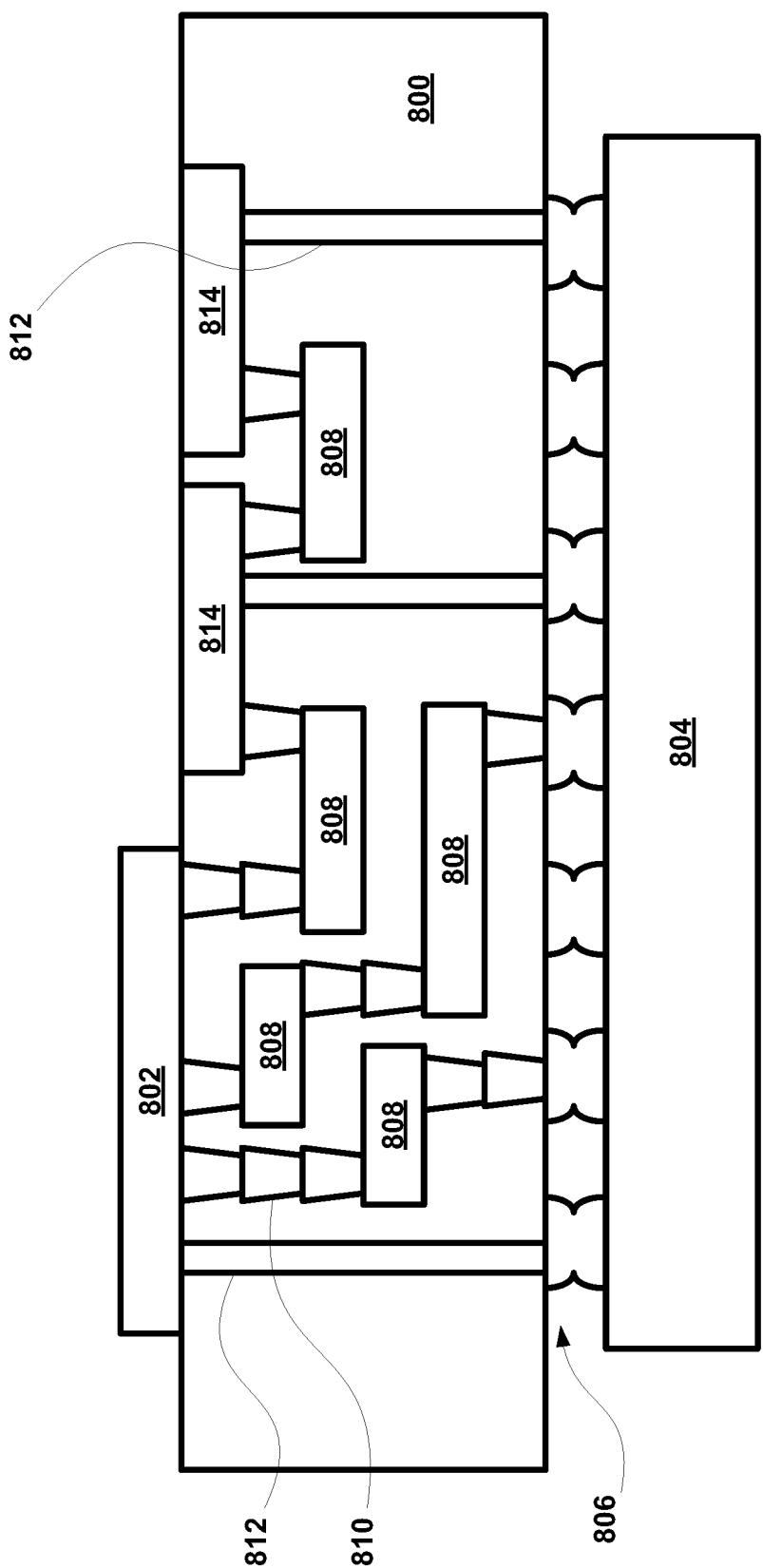
FIG. 8 illustrates an interposer that includes one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800.

In accordance with embodiments of the disclosure, apparatuses or processes disclosed herein may be used in the fabrication of interposer 800.

Figure 9:
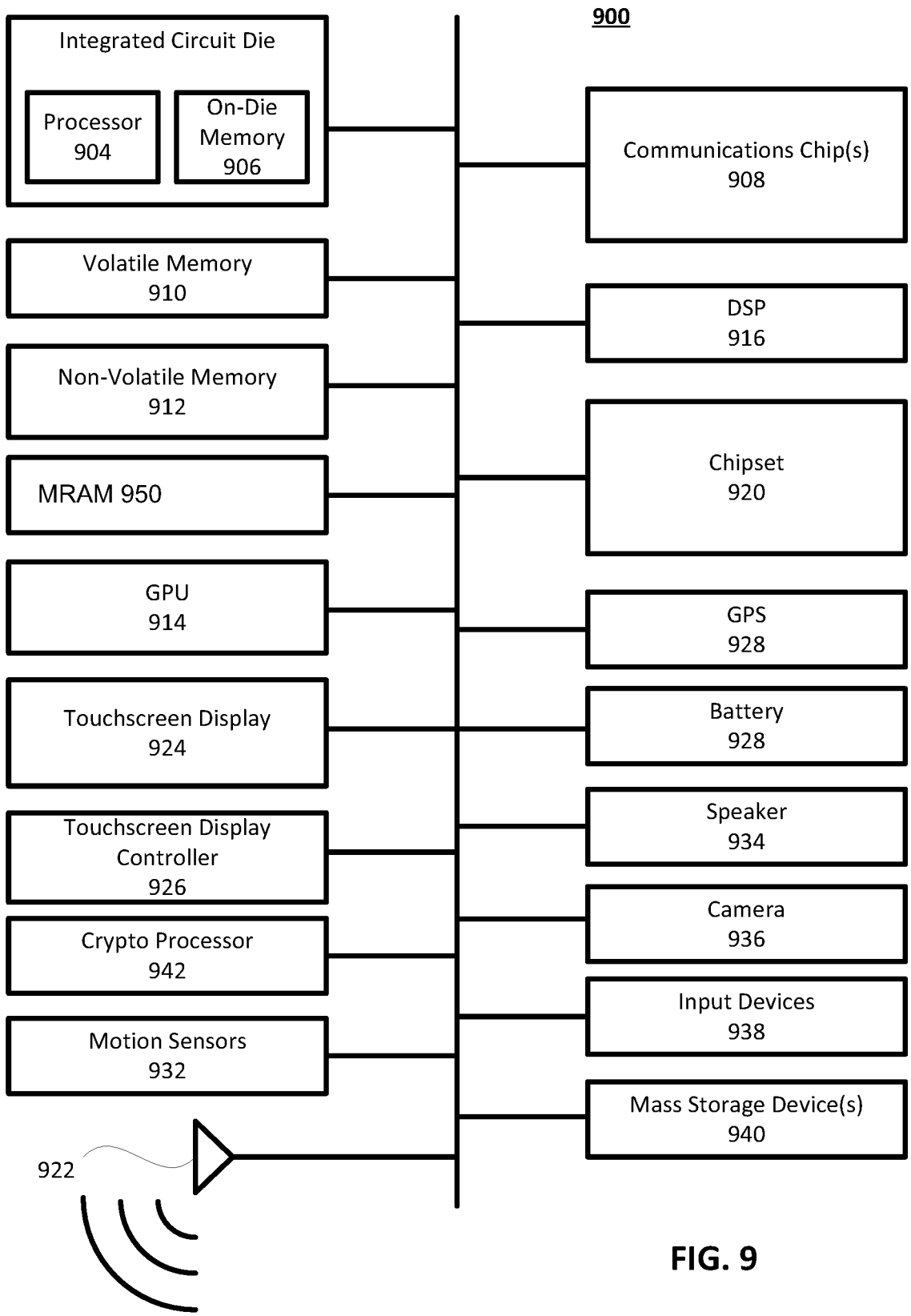
FIG. 9 illustrates a computing device in accordance with one embodiment of the disclosure

FIG. 9 illustrates a computing device 900 in accordance with one embodiment of the disclosure. The computing device 900 may include a number of components. In one embodiment, these components are attached to one or more motherboards. In an alternate embodiment, some or all of these components are fabricated onto a single system-on-a-chip (SoC) die. The components in the computing device 900 include, but are not limited to, an integrated circuit die 902 and at least one communications logic unit 908. In some implementations the communications logic unit 908 is fabricated within the integrated circuit die 902 while in other implementations the communications logic unit 908 is fabricated in a separate integrated circuit chip that may be bonded to a substrate or motherboard that is shared with or electronically coupled to the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STT-MRAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 928 or other power source, a power amplifier (not shown), a voltage regulator (not shown), a global positioning system (GPS) device 928, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications logic unit 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communications logic units 908. For instance, a first communications logic unit 908 may be dedicated to shorter range wireless communications such as Wi-Fi and Bluetooth and a second communications logic unit 908 may be dedicated to longer range wireless communications such as GPS, EDGE, GPRS, CDMA, WiMAX, LTE, Ev-DO, and others.

In various embodiments, the computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The relative sizes of features shown in the figures are not drawn to scale.

The following paragraphs provide examples of various ones of the embodiments disclosed herein.

Example 1 is a multi-layered printed circuit board that includes a first printed circuit board layer having an exposed side exposed to air; a second printed circuit board layer having an exposed side exposed to air; and a conductive layer residing between the first printed circuit board layer and the second printed circuit board layer, the conductive layer extending from the printed circuit board and defining an air gap between the conductive layer and the exposed side of at least one of the first printed circuit board layer or the second printed circuit board layer.

Example is 2 may include the subject matter of example 1, wherein the conductive layer is a ground layer of the multi-layered printed circuit board.

Example 3 may include the subject matter of any of examples 1 or 2, wherein the conductive layer comprises copper.

Example 4 may include the subject matter of any of examples 1 or 2, wherein the first printed circuit board layer and the second printed circuit board layer are configured to receive one or more circuit components.

Example 5 may include the subject matter of example 4, wherein the one or more circuit components are electrically connected to the conductive layer through a conductive via.

Example 6 may include the subject matter of any of examples 1-5, wherein the conductive layer is configured to thermally conduct heat away from the multi-layered printed circuit board.

Example 7 may include the subject matter of any of examples 1-6, wherein the multi-layered printed circuit board comprises a plurality of conductive layers extending from the multi-layered printed circuit board.

Example 8 is an integrated circuit (IC) package that includes a printed circuit board (PCB) that includes a conductive layer residing between a first printed circuit board layer and a second printed circuit board layer, the conductive layer extending from the printed circuit board and defining an air gap between the conductive layer and the exposed side of at least one of the first printed circuit board layer or the second printed circuit board layer, and a plurality of metal contact fingers residing on an edge of the PCB, at least some of the metal contact fingers electrically connected to the conductive layer. The IC package includes a PCB connection adaptor that includes a receiving portion configured to receive the PCB, the receiving portion comprising a plurality of metal contacts, and an interconnect portion configured to be received by an edge connector, the interconnect portion comprising a plurality of metal contact fingers electrically connected to the plurality of spring-loaded metal contacts of the receiving portion.

Example 9 may include the subject matter of example 8, wherein the receiving portion is offset from the interconnect portion.

Example 10 may include the subject matter of any of examples 8-9, wherein the plurality of metal contacts on the receiving portion comprises spring-loaded metal contacts, each of which align with a metal contact finger on the PCB.

Example 11 may include the subject matter of any of examples 8-10, wherein the conductive layer is a ground layer of the PCB.

Example 12 may include the subject matter of any of examples 8-11, wherein the conductive layer comprises copper.

Example 13 may include the subject matter of any of examples 8-12, wherein the PCB comprises a first printed circuit board layer having an exposed side exposed to air and a second printed circuit board layer having an exposed side exposed to air; and wherein the first printed circuit board layer and the second printed circuit board layer are configured to receive one or more circuit components.

Example 14 may include the subject matter of example 13, wherein the one or more circuit components are electrically connected to the conductive layer through a conductive via.

Example 15 may include the subject matter of example 13, wherein at least one of the one or more circuit components comprises a dynamic random access memory.

Example 16 may include the subject matter of any of examples 8-15, wherein the conductive layer is configured to thermally conduct heat away from the PCB.

Example 17 may include the subject matter of any of examples 8-16, wherein the PCB comprises a plurality of conductive layers extending from the PCB.

Example 18 is a dual inline memory module (DIMM) that includes a multi-layered printed circuit board (MLPCB), the MLPCB comprising a conductive layer, the conductive layer extending from the printed circuit board and defining an air gap between the conductive layer and the exposed side of at least one of the first printed circuit board layer or the second printed circuit board layer; and at least one dynamic random access memory (DRAM) element electrically and mechanically coupled to the MLPCB, the at least one DRAM electrically coupled to the conductive layer.

Example 19 may include the subject matter of example 18, wherein the MLPCB may include a first printed circuit board layer having an exposed side exposed to air and a second printed circuit board layer having an exposed side exposed to air; wherein the conductive layer resides between a first printed circuit board layer and the second printed circuit board layer.

Example 20 may include the subject matter of any of examples 18-19, wherein the conductive layer is a ground layer of the multi-layered printed circuit board.

Example 21 may include the subject matter of any of examples 18-20, wherein the conductive layer comprises copper.

Example 22 is a computing device that includes a processor mounted on a substrate; a communications logic unit within the processor; a memory within the processor; a graphics processing unit within the computing device; an antenna within the computing device; a display on the computing device; a battery within the computing device; a power amplifier within the processor; and a voltage regulator within the processor. The computing device includes a dual inline memory module (DIMM). The DIMM includes a multi-layered printed circuit board (MLPCB), the MLPCB comprising a conductive layer, the conductive layer extending from the printed circuit board and defining an air gap between the conductive layer and the exposed side of at least one of the first printed circuit board layer or the second printed circuit board layer; and at least one dynamic random access memory (DRAM) element electrically and mechanically coupled to the MLPCB, the at least one DRAM electrically coupled to the conductive layer.

Example 23 may include the subject matter of example 22, wherein the MLPCB comprises a first printed circuit board layer having an exposed side exposed to air and a second printed circuit board layer having an exposed side exposed to air; wherein the conductive layer resides between a first printed circuit board layer and the second printed circuit board layer.

Example 24 may include the subject matter of any of examples 22-23, wherein the conductive layer is a ground layer of the multi-layered printed circuit board.

Example 25 may include the subject matter of any of examples 22-24, wherein the conductive layer is configured to thermally conduct heat away from the PCB.

Example 26 may include the subject matter of any of examples 22-25, wherein the PCB comprises a plurality of conductive layers extending from the PCB.

In the preceding description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

What is claimed is:

1. An electronic component, comprising:
a multi-layered printed circuit board (PCB) having a first PCB layer at a first surface of the multi-layered PCB and a second PCB layer at a second surface of the multi-layered PCB, wherein the second surface is opposite to the first surface, the multi-layered PCB has a first side surface that is not parallel to the first surface or the second surface, and the multi-layered PCB has a second side surface different than the first side surface;
a conductive structure extending from the first side surface of the multi-layered PCB and folding back toward the multi-layered PCB such that a first portion of the conductive structure is between the first PCB layer and the second PCB layer, the first PCB layer is between a second portion of the conductive structure and the first portion of the conductive structure, and the second portion of the conductive structure is spaced apart from the first surface of the multi-layered PCB; and
a plurality of metal contact fingers proximate to the second side surface, wherein the plurality of metal contact fingers are to be received in a socket.

2. The electronic component of claim 1, wherein the conductive structure includes a ground layer of the multi-layered PCB.

3. The electronic component of claim 1, wherein the conductive structure includes copper.

4. The electronic component of claim 1, further comprising:

a circuit component coupled to the first surface of the multi-layered PCB, wherein the circuit component is between the second portion of the conductive structure and the first surface of the multi-layered PCB.

5. The electronic component of claim 4, wherein the circuit component is electrically connected to the conductive structure through a conductive pathway in the multi-layered PCB.

6. The electronic component of claim 4, wherein the circuit component includes a memory device.

7. The electronic component of claim 1, wherein the conductive structure is a first conductive structure, and the electronic component further includes:
a second conductive structure extending from the first side surface of the multi-layered PCB and folding back toward the multi-layered PCB such that a first portion of the second conductive structure is between the first PCB layer and the second PCB layer, the first PCB layer is between a second portion of the second conductive structure and the first portion of the second conductive structure, and the second portion of the second conductive structure is spaced apart from the first surface of the multi-layered PCB.

8. The electronic component of claim 1, wherein the second side face is opposite to the first side face.

9. An integrated circuit (IC) assembly, comprising:
a printed circuit board (PCB), including:
a conductive material extending from a first side face of the PCB such that a first portion of the conductive material is between a first PCB layer and a second PCB layer, and the first PCB layer is between the first portion of the conductive material and a second portion of the conductive material, and
a plurality of metal contact fingers proximate to a second side face of the PCB, wherein the second side face of the PCB is different than the first side face of the PCB; and
a PCB connection adaptor, comprising:
a socket to receive the PCB, the socket including a plurality of metal contacts complementary to the plurality of metal contact fingers, and
an interconnect portion to be received by an edge connector, the interconnect portion comprising a plurality of metal contact fingers electrically connected to the plurality of metal contacts of the socket.

10. The IC assembly of claim 9, wherein the plurality of metal contacts of the socket are not coplanar with the plurality of metal contact fingers of the interconnect portion.

11. The IC assembly of claim 9, wherein the plurality of metal contacts of the socket includes spring-loaded metal contacts.

12. The IC assembly of claim 9, wherein the conductive material includes copper.

13. The IC assembly of claim 9, further comprising:
a circuit component coupled to a face of the PCB.

14. The IC assembly of claim 13, wherein the circuit component is electrically connected to the conductive material through a conductive pathway in the PCB.

15. The IC assembly of claim 13, wherein the circuit component includes a dynamic random access memory.

16. The IC assembly of claim 9, wherein the conductive material is a first conductive material, and the PCB further includes:
a second conductive material extending from a side face of the PCB such that a first portion of the second conductive material is between the first PCB layer and the second PCB layer, and the first PCB layer is between the first portion of the second conductive material and a second portion of the second conductive material.

17. The IC assembly of claim 9, wherein first PCB layer is at a face of the PCB, and the second portion of the conductive material is spaced apart from the face of the PCB by an air gap.

18. A dual inline memory module (DIMM), comprising:
a multi-layered printed circuit board (MLPCB) structure, wherein the MLPCB structure includes a conductive material having a first portion embedded within an MLPCB and a second portion spaced away from and parallel to a face of the MLPCB, and the MLPCB structure does not include any electronic components coupled to the second portion of the conductive material; and
at least one dynamic random access memory (DRAM) element coupled to the MLPCB structure.

19. The DIMM of claim 18, wherein the conductive material includes a third portion between the first portion and the second portion, wherein the third portion is perpendicular to the second portion and to the first portion.

20. The DIMM of claim 18, wherein the at least one DRAM element is between the second portion of the conductive material and the face of the PCB.

* * * * *